(12) United States Patent
Stallard et al.

(10) Patent No.: US 7,002,139 B2
(45) Date of Patent: Feb. 21, 2006

(54) WINDOW MOUNTING FOR OPTICAL SENSOR

(75) Inventors: Charles R. Stallard, Kemp, TX (US); William H. Wellman, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 215 days.

(21) Appl. No.: 10/422,391

(22) Filed: Apr. 23, 2003

(65) Prior Publication Data

US 2004/0211892 A1 Oct. 28, 2004

(51) Int. Cl.
*H01J 40/14* (2006.01)
*H01J 5/02* (2006.01)

(52) U.S. Cl. ....................... 250/239; 359/512
(58) Field of Classification Search ............... 250/216, 250/239; 359/507–514; 244/3.16–3.18
See application file for complete search history.

(56) References Cited

U.S. PATENT DOCUMENTS

| | | | |
|---|---|---|---|
| 4,621,279 A | 11/1986 | Maier et al. | |
| 4,699,335 A | 10/1987 | DeOms et al. | |
| 4,836,013 A * | 6/1989 | Constantin | ..................... 73/41 |
| 6,097,553 A | 8/2000 | Griffin | |
| 6,130,448 A | 10/2000 | Bauer et al. | |
| 2001/0017880 A1 * | 8/2001 | Beerwerth et al. | .......... 374/158 |

FOREIGN PATENT DOCUMENTS

| | | |
|---|---|---|
| FR | 2583890 | 12/1986 |
| JP | 58012479 | 1/1983 |

* cited by examiner

Primary Examiner—David Porta
Assistant Examiner—Patrick J. Lee
(74) Attorney, Agent, or Firm—William C. Schubert; Karl A. Vick

(57) ABSTRACT

A window mounting system for optical sensors including a removable connection for window replacement, an alignment system to assure precision registration of the window or dome with the sensor internal optics, and thermal insulation to limit heat transfer from the window to the optics housing and sensor. The removable connection maintains precise optical alignment of curved domes with significant optical power, yet also is effective with simple flat windows.

20 Claims, 5 Drawing Sheets

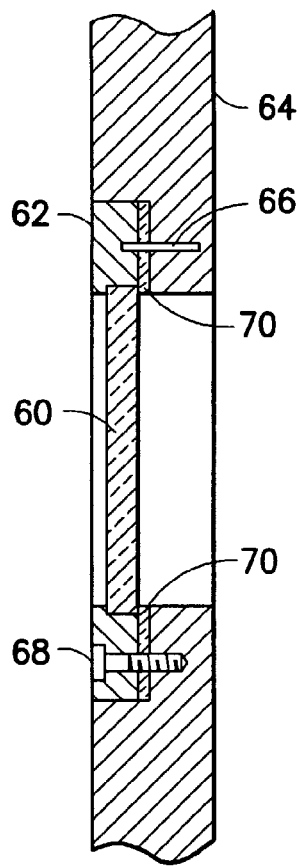
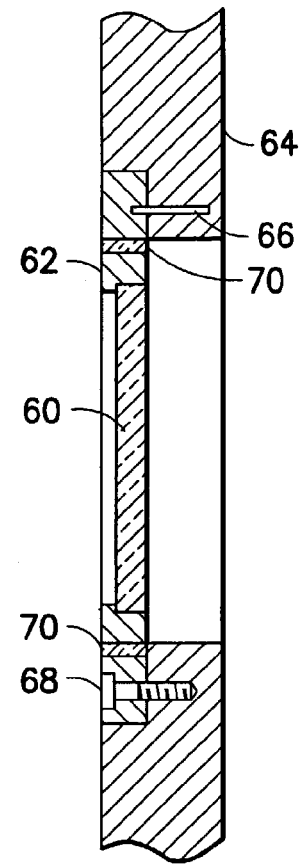
FIG.3  FIG.4
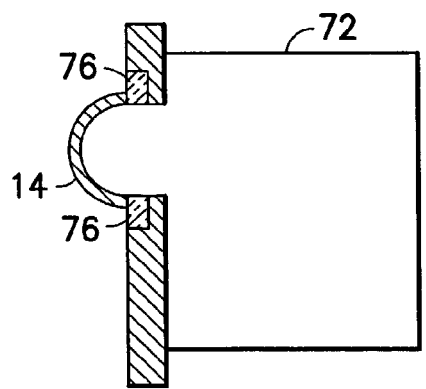
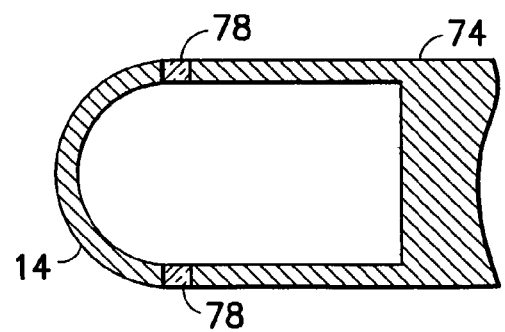
FIG.5  FIG.6

WINDOW MOUNTING FOR OPTICAL SENSOR

BACKGROUND OF THE INVENTION

1. Field of the Invention

The present invention relates to optical sensors and, more particularly, to mounting of a window over an optical sensor.

2. Brief Description of Prior Developments

Most methods for mounting a dome window to an optics housing include large, flat contact surfaces on either the outside diameter or on the base flat or equivalent which readily transfer thermal energy. Layer(s) of insulating material can be added to provide a thermal barrier, but these typically add greatly to the tolerances for spacing, centering, and wedge of sensitive optical or electrical components. Retention grooves in the outside surface of a dome window create high stress points, and they attract dirt and moisture which can also contribute to early failure. Large contact areas on the outside of a dome are high thermal transfer rate areas, and this is undesirable in most applications.

SUMMARY OF THE INVENTION

In accordance with one aspect of the present invention, an optical sensor cover system is provided including an optics housing adapted to house an optical sensor therein; and a window connected to the optics housing by a removable connection. The removable connection comprises a thermal transfer path between the window and the optics housing which comprises a heat transfer limiting system to limit heat transfer from the window to the optics housing.

In accordance with another aspect of the present invention, an optical sensor cover system is provided comprising an optics housing adapted to house an optical sensor therein; and a dome shaped window connected to the optics housing by a removable connection. The dome window contacts the optics housing only along a concave interior surface at a protruding surface of the optics housing to align the dome window relative to the optics housing and limit conductive heat transfer from the dome window to the optics housing.

In accordance with one method of the present invention, a method of mounting a dome window to an optics housing is provided comprising steps of positioning the dome window on the optics housing with only a portion of an interior concave surface of the dome window contacting the optics housing at an outer tip of the optics housing; and applying force to the dome window by an O-ring seal to align the dome window at a predetermined position on the optics housing. An area of contact between the outer tip of the optics housing and the dome window is small to limit conductive heat transfer from the dome window to the optics housing. The seal can be removed to remove the dome window from the optics housing.

In accordance with another method of the present invention, a method of mounting a window to an optics housing is provided comprising steps of bonding the window to a window frame; removably connecting the window frame to the optics housing at a removable connection, the removable connection comprising alignment members extending between the window frame and the optics housing to align the window relative to an open area of the optics housing; and providing heat transfer insulation between the window and the optics housing.

BRIEF DESCRIPTION OF THE DRAWINGS

The foregoing aspects and other features of the present invention are explained in the following description, taken in connection with the accompanying drawings, wherein:

FIG. 3 is a diagrammatic cross sectional view of an alternate embodiment of the cover system shown in FIG. 1;

FIG. 4 is a diagrammatic cross sectional view of another alternate embodiment of the cover system shown in FIG. 1;

FIG. 5 is a schematic diagram of another alternate embodiment of the cover system shown in FIG. 3;

FIG. 6 is a schematic diagram of another alternate embodiment of the cover system shown in FIG. 3;

DETAILED DESCRIPTION OF THE PREFERRED EMBODIMENT

Figure 1:
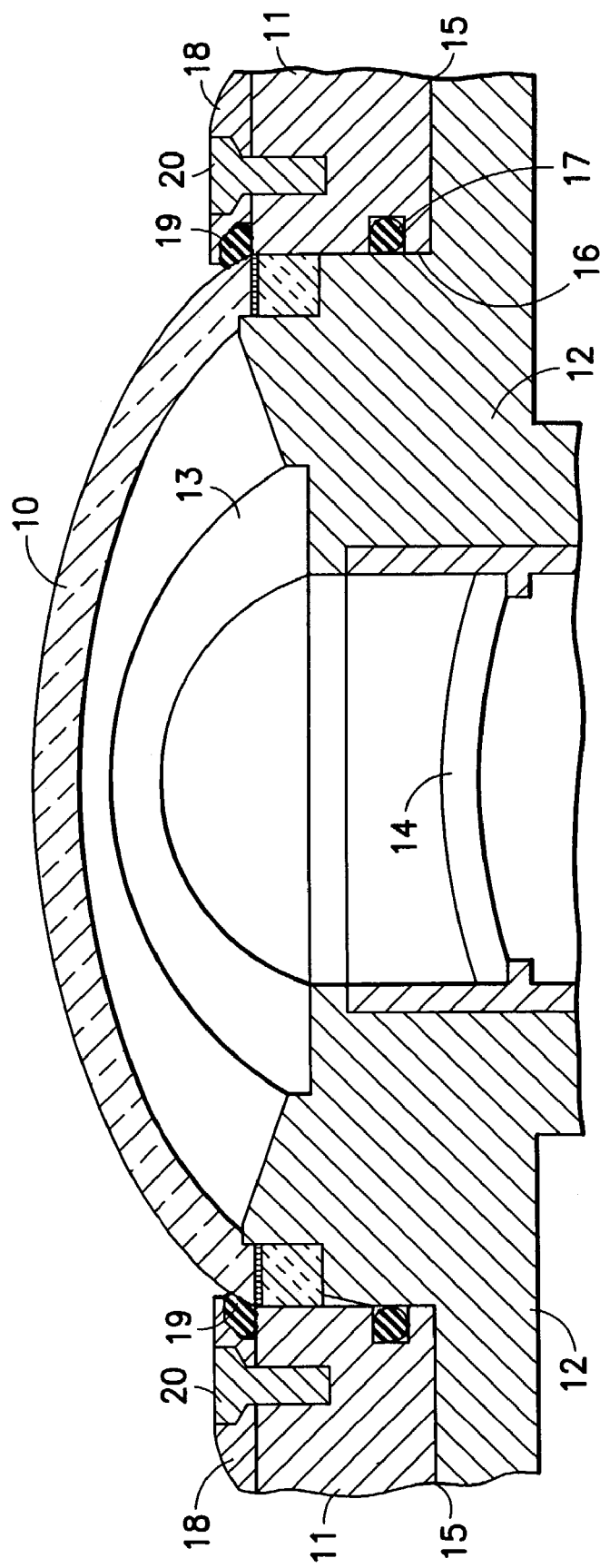
FIG. 1 is a partial cross sectional view of an optical sensor cover system incorporating features of the present invention.

Referring to FIG. 1, there is shown a partial cross sectional view of an optical sensor system incorporating features of the present invention. Although the present invention will be described with reference to the exemplary embodiments shown in the drawings, it should be understood that the present invention can be embodied in many alternate forms of embodiments. In addition, any suitable size, shape or type of elements or materials could be used.

The system generally comprises a window 10, a sensor housing 11, an optics housing 12, and a removable retention ring 18. Optics housing 12 includes lens element 13 and 14, and other components not illustrated. Optics housing 12 mounts within a central opening in sensor housing 11, and is held in alignment by face 15 and inside diameter 16, or by other means not critical to this invention. Elastomeric "O-ring" 17 seals the interior of the optics assembly against dust and moisture, by pressing against sensor housing 11 and optics housing 12. These details of mounting the optic are not critical to this invention, so other designs can be used without conflicting with the principles of this invention.

Window element 10 is attached to the sensor housing 11 by a removable connection that comprises retention ring 18, seal member 19, and fastener 20. Multiple fasteners 20 are located at several places about the diameter of retention ring 18, and hold window 10 firmly against optics housing 12 and seal member 19. Fasteners 20 engage the sensor housing 11, within which optics housing 12 is mounted. The seal member 19 is preferably a flexible or elastomeric O-ring. However, in an alternate embodiment, any suitable type of seal member could be provided. Retention ring 18 is sized and shaped to receive the O-ring seal 19 therein. As flange 18 presses the O-ring seal 19 against both window 10 and sensor housing 11, a seal is created against dust and moisture intrusion.

Figure 2:
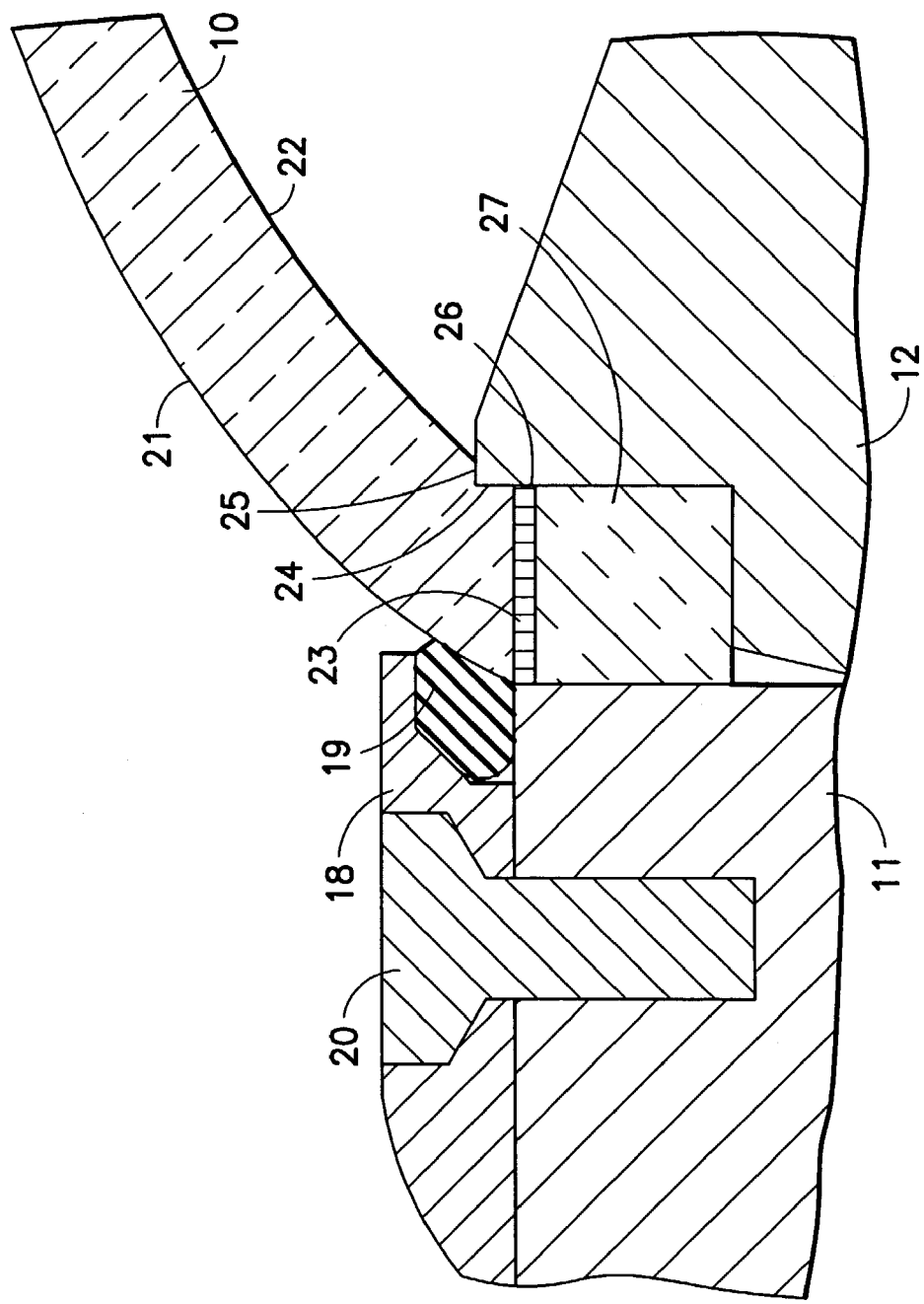
FIG. 2 is a partial enlarged cross sectional view of an area of the cover system shown in FIG. 1.

Referring to FIG. 2, the window retention and general position is assured by fastening to sensor housing 11, as previously described. Window element 10 has optical surfaces defining the window exterior 21 and interior 22, and customary window edge 23, which are conventional optics details. Window element 10 also has additional precision cylindrical diameter 24 that mates with corresponding precision diameter in optics housing 12. The window also has a precision flat surface 25 that similarly mates with a corresponding precision height reference in optics housing 12. These two precision surfaces assure accurate alignment of the window element 10 with optics housing 12, even if the optics housing 12 is slightly misaligned with sensor housing 11. The elastomeric nature of seal member 19 accommodates such small misalignments, and enables the window to be mounted to the overall sensor housing 12. As the seal 19 is pressed down against the window 14, the seal 19 applies a force to the window 10 to center the window towards a center established by precision surfaces 24 and 25 of the optics housing 12.

Window 10 is in contact with optics housing 12 at only a small area defined by precision surfaces 24 and 25. Flat edge 23 makes broad contact with heating element 26 and insulating element 27. Insulating element 27 and small contact areas 24 and 25 block heat flow into sensor housing 11 and optics housing 12. Dome heating for defrosting, thus, is efficient in cold conditions, and unwanted aerodynamic heating is blocked from the sensor in hot conditions.

In addition, this mounting to housing 12 by retaining flange 18 and fasteners 20 allows replacement of window 10 without disassembly of optics housing 12 from sensor housing 11. When the window is mounted to the sensor housing 11, it is precisely aligned to optics 12. User replacement of window 10, thus, can be done without sensor disassembly or risk of window misalignment.

Commercial application for the present invention could comprise any application requiring or preferring very low thermal transfer rate from one component to another component while maintaining accurate positioning and/or alignment. The dome mounting method can be made a part of a wide angle, infrared airborne optical system. In some applications, such as described in U.S. provisional patent application entitled "Submicron Tolerance Lens Design Method" Application No. 60/340,162 filed in 2001, which is hereby incorporated by reference in its entirety, the dome must be positioned with precision. In addition to accomplishing this precision, the dome mounting method of the present invention also minimizes conductive heat load to the housing. Suitable means could also be provided to address radiated heat transfer, such as use of a special coating on the inside surface to transmit desired wavelengths while reflecting other wavelengths that merely cause radiative heating of the optical surface.

With the present invention, the dome window can be replaceable on an aircraft without risk of the optics being dislodged. With an O-ring in the triangular cavity, complete sealing is accomplished between the dome, the optics housing and the sensor housing. Loosening mounting screws for the mounting assembly could allow movement of the optics assembly with the dome. That would release tension on the O-ring such that the O-ring could now be removed. That would allow the dome to be removed and replaced, and a new sealing O-ring installed.

The dome location is controlled and toleranced by single surfaces 24, 25 which are part of the lens cell assembly. Due to the small contact area of the dome and the optics housing, the heat transfer rate across this interface will be very low and, thus, beneficial to image quality during dome friction heating.

This dome mounting method minimizes the contact area with media that will readily transfer or absorb heat from the dome to optical housing or components. Large contact areas mate with insulating O-ring seals and with a heater assembly which is insulated from other optics. Since a dome normally requires an accurate centering tolerance, nearly mating pilot diameters on the dome and on the optics housing are designed for minimum contact and heat transfer. By designing the support and control interface area to be on the inside dome surface near the outside perimeter, the outside surface of the dome is clear of any trapped dirt in grooves or freezing moisture in surface retention cavities. The pressure generated by the outside surface O-ring to seal and retain the dome also causes the dome to be accurately positioned and tolerance controlled by the inner mounting interface surfaces. This arrangement generates very low distortion stresses in the dome surface, and thus the dome is likely to survive fracture impacts that would otherwise destroy a moderately to highly stressed dome. Most of the heat generated by aerodynamic friction is contained within the dome, but because of the very low mount distortion stresses, there is little or no optical distortion of the dome.

Using the O-ring to generate a balanced, controlled, thrust vectored force while sealing multiple surfaces from the environment is unique. Using a heater for de-icing of the dome, mounting the heater directly to a large flat dome surface, but mounting it such that no heat is transferred to the optics or housing is also unique. By putting the precision, tolerance controlled, mounting interface on the inside surface of the dome opposite the O-ring pressure, and by minimizing the optics housing contact area, we have created a thermal transfer path that is very restrictive. High speed airflow over the dome or the de-iceing heater can generate very hot dome surfaces, but there is a very small path for thermal transfer into the optics or optics housings. Almost all of the conductive thermal transfer must take place at the only optics housing surface that is in full, intimate contact with the dome. That surface is normal to the optics axis and only wide enough to keep the dome stress concentrations very low. The adjacent radial pilot diameters are sized such that those surfaces will only touch, without excess pressure, in one small spot if all of the control tolerances go in one direction.

The transfer of heat from a dome or window to optics or the optics mounting housing can be a difficult problem, especially on optical systems mounted in high-speed aircraft. The high-speed airflow over an optics dome generates a large amount of heat, part of which is transferred to some optical elements. The transient heat absorbed may cause localized distortion of a lens or lenses and optical housings, out of focus, etc.

Another problem often encountered is that the allowable de-centering and spacing tolerance of a dome with respect to the next optical element is larger than allowable per the optical prescription. Since most applications require that the dome be removable from the outside of the aircraft, the tolerance stack-up has a number of contributors. The contributors generally are; (1) dome outside pilot diameter and surface to the dome mount in the aircraft with (2) additional radial clearance to allow for the materials differing Coefficient of Thermal Expansion (CTE) over the operating temperature range, (3) aircraft dome mount-to-optics assembly mount dimensions, (4) optics assembly mount to the lens mount housing, (5) lens mount to the potting diameter and surface, (6) lens potting positional tolerance, and finally, (7) the lens outside diameter to the true lens optical centerline and mounting surface.

This dome mounting method minimizes the thermal transfer contact area between the dome and the optics housing, while drastically reducing the number of tolerance contributors. The dome mounting surface to lens mounting surface tolerance is controlled by one dimension on a common housing. Likewise, the centering of the dome (inside surface) pilot diameter to the lens pilot diameter tolerance is controlled by one dimension on a common housing.

As portrayed in the figures, by moving the dome interface to an inside radius surface, a common housing can be used to mount both the dome 14 and first lens 18. Thus, one dimension controls centering and one dimension controls spacing. By selecting a material for the housing that minimizes the CTE difference with the dome, very little additional clearance is needed to allow for material size changes during wide temperature excursions. Given the proper dimensions, the dome does not touch any other thermally conductive surface, except the added defrost heater element shown in the figure. While the heater makes excellent thermal contact with the dome, the heater is thermally insulated from all other optical elements and housings.

The design reduces heat transfer from a dome into other elements of an optical system, while preserving accurate alignment of the dome with the other optics. This minimizes thermal distortion of the optics that could degrade image focus, and it also enables incorporation of a dome heater for dome defrosting or deicing. However, thermally isolating the dome from the sensor and lens has other important advantages.

Reducing heat transfer reduces undesirable image patterns in infrared sensors that are sensitive to patterns in dome thermal emissions, because heat flow through the dome into the sensor housing is a major source of dome temperature gradients. Blocking heat flow into the sensor also reduces sensor temperature rise of the sensor. This can be important to performance of infrared sensors, and reliability of infrared and other types of sensors. The unusual compactness and wide-angle optical coverage of some sensors make it particularly sensitive to dome thermal gradients and thermal coupling. In addition, while the first embodiment's approach provides extremely accurate positioning of the dome, many systems can tolerate modest placement errors that arise from other alignment means, so such schemes should be included for completeness. Another acceptable method separately aligns the dome to a common sensor housing.

The present invention could apply generally to any equipment, not just to infrared sensors. This design concept can apply to infrared products that are subject to harsh aerodynamic heating. It meets strenuous requirements, and is a creative solution to an unusual problem. The advantages claimed for this invention represent a unique combined knowledge of thermodynamics and optical systems.

This concept is important to sensors performing in the severe aerodynamic heating of required high-speed dash conditions. Such conditions apply quite commonly to infrared missile warning systems for aircraft, and probably to competing ultraviolet and visible systems. Blocking temperature gradients across the sensor dome also is important to avoiding image non-uniformity, a potentially serious problem.

The first embodiment achieves thermal isolation with ultra-precise registration of the dome element, and discusses thermal-mechanical concerns. However, there also are significant infrared systems benefits, which apply more broadly to sensors with or without ultra-precise dome registration. Infrared sensors in which the entrance pupil is coincident with the window element have the problem that undesirable image non-uniformities are caused by non-uniformities in dome or window temperature, particularly if the optical field-of-view is very wide. And, sensors that are compact are unusually sensitive to aerodynamic heating, due to their small thermal inertia and restricted placement of components, and their dome or outer window being a large area on the outer sensor face that is exposed to the airstream.

Infrared sensors usually are not ultra-compact, thus avoid this problem inasmuch as their relatively smaller exposed area couples less heat into the unit and their higher thermal inertia slows temperature rise, thereby preventing excessive sensor heating during high speed dash for typically-limited short periods. In addition the interior size is large enough that thermal paths from the housing to sensitive components can be minimized. Similarly, prior infrared seekers have short flight times and couple the dome thermally to the long missile body, which has substantial mass and is insulated from interior components. In addition, infrared sensors and seekers use telephoto optics with an entrance pupil near the outer window (placed directly or by re-imaging), which makes the sensor immune to hot-window emission patterns.

Referring now also to FIG. 3, an alternative design uses either a shallow dome or flat window 60 that is bonded to a mounting frame 62. This frame 62 is registered to the sensor body 64 through alignment pins 66, and held in place with screws or bolts 68, which renders it field-replaceable. Alignment is assured by the pin 66 registration, and mounting is made secure by the bolts 68. Between this frame 62 and the sensor body 64, a sheet of insulating material 70 isolates the dome or window 60 from the sensor housing 64. Alternatively, as seen in FIG. 4, the window frame 62' itself may contain an insulating structure 70' that is bonded into the frame.

Note that these designs are shown with a flat window, but apply equally well to mounting of a curved dome. While shown for a sensor with a flat front face, these designs also apply equally well to mounting on a missile with straight sides. FIGS. 5 and 6 illustrate these variations of the basic concept, without repeating the details of the insulated mount. The dome 14 is attached by an insulating frame 76 with the sensor 72 shown in FIG. 5. The dome 14 is attached by an insulating frame 78 with the missile 74 shown in FIG. 6. The sensor housing is parallel with the external surface of the sensor shown in FIG. 5 or missile shown in FIG. 6, presenting a smooth outer surface. This external surface for the sensor 72 is the flat front face (FIG. 5), and for the missile 74 is the cylindrical outer body (FIG. 6). Thus, in a detailed section view, the frame for the missile mount would be turned 90 degrees relative to that shown in FIGS. 3 and 4 for the sensor mount.

Figure 7:
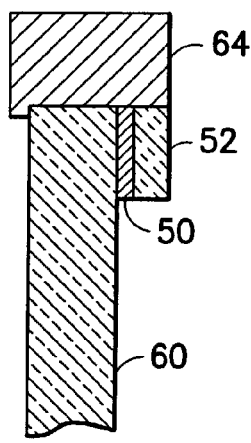
FIG. 7 is a partial diagrammatic view of one form of connecting a heater to a window.
Figure 8:
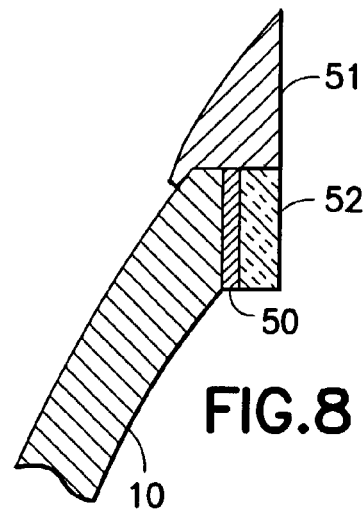
FIG. 8 is a partial diagrammatic view of one form of connecting a heater to a dome shaped window.

Defrosting can be done through a separate heating element. In the embodiments shown in FIGS. 1 and 2 the heater 26 is placed in contact with the window edge (or dome rim), atop the thermal insulator 27, so heat flows into the dome and not into the sensor. Heating also can be done by imbedding the heater in the window mount, as shown in FIGS. 7–8. In this case, the mount can include a rigid insulator 52 to block heat from the mount surface that contacts the sensor. The embodiment shown in FIG. 7 has a flat window 60 with a heater 50 in contact therewith. A thermal insulator 52 is provided to insulate the heater 50 from the frame 64. The embodiment shown in FIG. 8 has a dome window 10 with a heater 50 in contact therewith. A thermal insulator 52 is provided to insulate the heater 50 from the frame 51.

Figure 9:
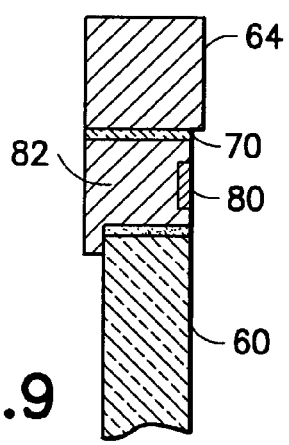
FIG. 9 is a partial diagrammatic view of another form of connecting a heater to a window.
Figure 10:
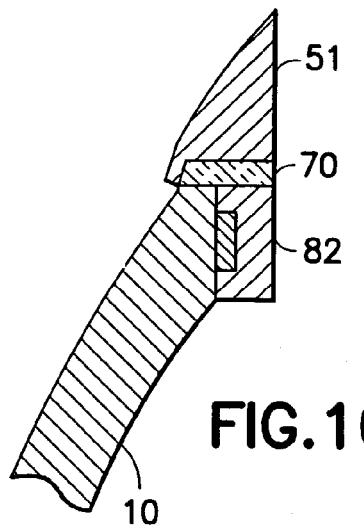
FIG. 10 is a partial diagrammatic view of another form of connecting a heater to a dome shaped window.

In an alternate embodiment, the entire mount can be insulated as shown in FIGS. 9–10, respectively. The embodiment shown in FIG. 9 has a flat window 60 attached to a heater 80 and frame 82. The heater and frame are attached by a thermal insulator 70 to the attachment frame 64. The embodiment shown in FIG. 10 has a dome window 10 attached to a heater and frame assembly 82. The heater and frame assembly 82 is insulated from the attachment frame 51 by the thermal insulator 70.

Figure 11:
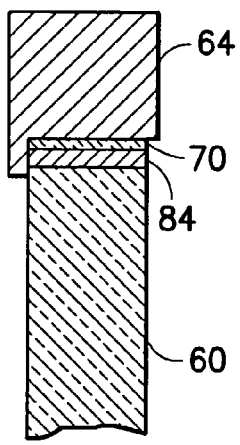
FIG. 11 is a partial diagrammatic view of another embodiment for heating a flat window.
Figure 12:
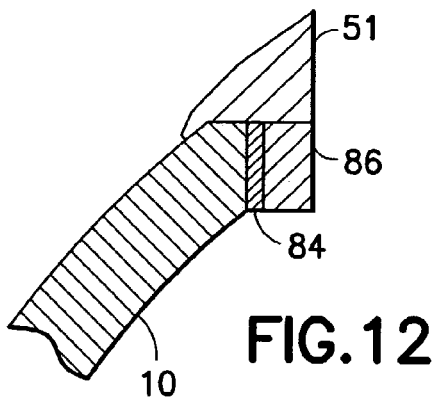
FIG. 12 is a partial diagrammatic view of another embodiment for heating a dome shaped window.

Heating also can be done through direct electrical conduction through the window or dome as shown in FIGS. 11–12. In this case, the thermal insulator doubles as an electrical insulator, and heating current is applied through electrical contacts that are suitably placed on alternative sides of the window. The embodiment shown in FIG. 11 has a flat window 60 in direct contact with an electrical contact 84. An electrical insulator 70 is provided between the contact 84 and the frame 64. The embodiment shown in FIG. 12 has a dome window 10 in direct contact with the electrical contact 84. A spacer 86 is provided to insulate the contact 84 from the optics housing. Contacts can be made by flame spraying and electroplating, giving an interface to which wires can be soldered. Or, instead of flame spraying and plating, copper foil can be bonded with conductive adhesive.

Figure 13:
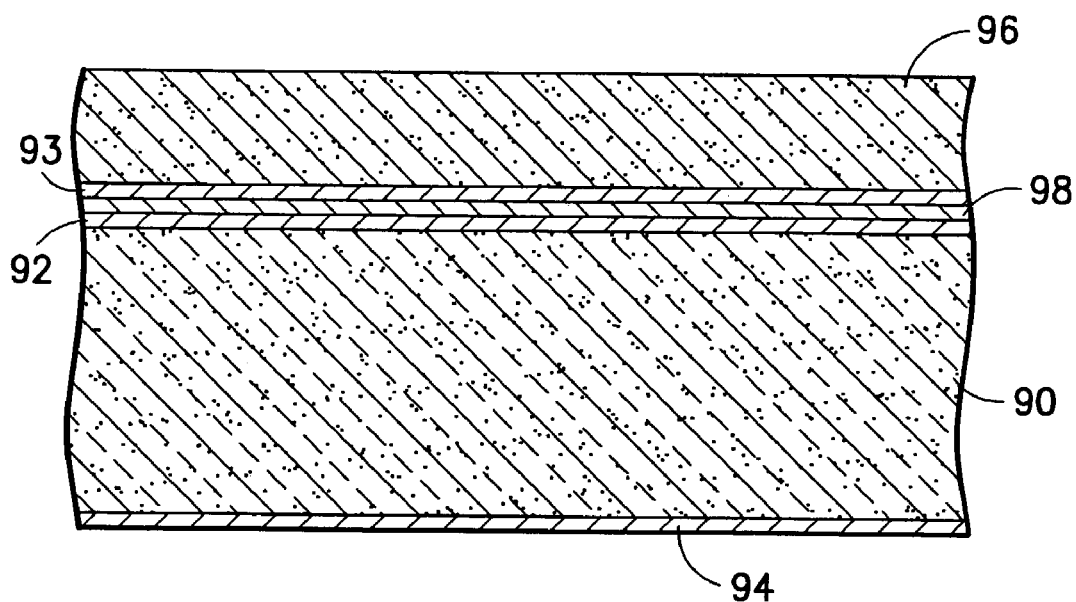
FIG. 13 is a partial cross sectional view of one type of window for use with the present invention.
Figure 14:
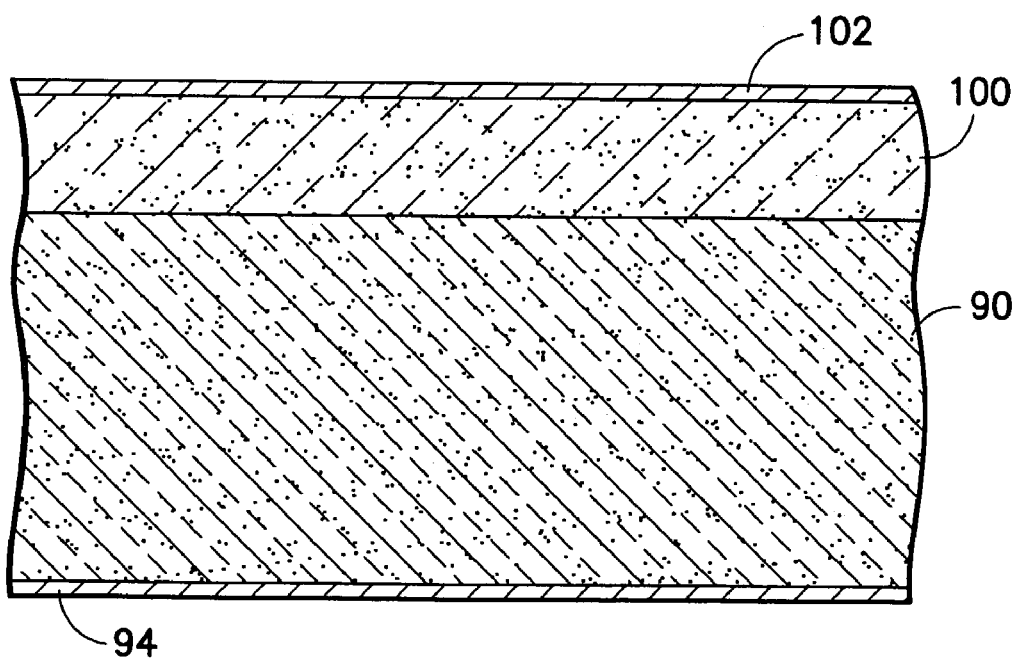
FIG. 14 is a partial cross sectional view of another type of window for use with the present invention.

The first test windows built for sensors had a conductive silicon window, as shown in FIG. 13. FIG. 14 shows an alternative. For the embodiment shown in FIG. 13, the window comprised a mono-crystalline silicon window layer 90 doped for de-icing and anti-reflection coatings 92, 93, 94. For scratch resistance, the conductive silicon layer 90 was covered with a bonded layer of durable aluminum oxynitride (ALON) 96 by a high-temperature IR-transmissive adhesive 98. For the embodiment shown in FIG. 14, the window comprised the layer 90, entire reflection coating 94, polycrystalline silicon layer 100 fused directly on the layer 90, and an exterior coating 102 comprising a one quarter wavelength zirconia exterior coating. In another common embodiment, individual windows have heater wires soldered onto copper foil conductors that were physically and electrically bonded to opposite window edges. In alternate embodiments, any suitable type of window construction could be used.

This invention accommodates all these window heating embodiments described above by integrating an insulating material into the window to mount block heat flow. The FIGS. 3–12 embodiments use rigid insulating material to maintain an accurate registration during assembly and field replacement.

In all cases, insulating the window blocks heat flow into the cooler sensor which temperature rise within the sensor. This also lowers thermal gradients across the window that could cause image patterns, since the window rises to a uniform temperature.

The combined window/dome features of better temperature uniformity, lower thermal conduction into the sensor, and multiple defrosting/deicing options are not incorporated in designs of any known infrared equipment. Deicing by electric conduction does not require thermal isolation, just power. Missile seekers use solid mounting of the dome to the missile body, which protects interior parts by thermal inertia. Forward looking infrared systems (FLIRs) similarly use thermal inertia of the relatively large housing. Both seekers and FLIRs place the entrance pupil at the window or dome, thus minimize image pattering from window or dome temperature gradients. Such prior sensors/seekers neither require nor use this novel design.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An aircraft optical sensor cover system comprising:
   an aircraft optics housing adapted to house an optical sensor therein and connect the optical sensor to an aircraft; and
   a window connected to the optics housing by a removable connection,
   wherein the removable connection comprises thermal insulation between the window and the optics housing which comprises a heat transfer limiting system to limit heat transfer from the window from aerodynamic heating to the optics housing.

2. An optical sensor cover system as in claim 1 wherein the removable connection comprises an O-ring seal pressing against the window.

3. An optical sensor cover system as in claim 2 further comprising a main housing having the optics housing connected thereto, wherein the removable connection comprises a flange member removably connected to the main housing which pressing the O-ring seal against the window and, wherein the O-ring seal forms a seal with the main housing and the window.

4. An optical sensor cover system as in claim 1 wherein the window comprises a general dome shape, and wherein the heat transfer limiting system comprises the dome window contacting the optics housing only along an interior surface of the optics housing that also aligns the dome window relative to the optics housing and limits conductive heat transfer from the dome window to the optics housing.

5. An optical sensor cover system as in claim 1 further comprising a heater assembly connected between the optics housing and the window, wherein the heater assembly is thermally insulated from the optics housing.

6. An optical sensor cover system as in claim 1 further comprising a window frame, wherein the window is bonded to the window frame, and wherein the window frame is removably connected to the optics housing.

7. An optical sensor cover system as in claim 6 further comprising alignment members extending between the window frame and the optics housing for aligning the window relative to an open area of the optics housing.

8. An optical sensor cover system as in claim 6 wherein the transfer limiting system comprises thermal insulation between the window and the optics housing.

9. An optical sensor cover system as in claim 8 wherein the thermal insulation is located in the window frame.

10. An optical sensor system comprising:
    multiple lens elements; and
    an optical sensor cover system as in claim 1 having the lens elements located in the optics housing.

11. An optical sensor cover system as in claim 1 wherein the window comprises electrical contacts.

12. An optical sensor cover system as in claim 1 wherein the window comprises a mono-crystalline silicon window doped for de-icing and having an anti-reflective coating.

13. An aircraft optical sensor cover system comprising:
an aircraft optics housing adapted to house an optical sensor therein and connect the optical sensor to an aircraft; and
a dome shaped window connected to the optics housing by a removable connection,
wherein the dome window contacts the optics housing only along a concave interior surface at a protruding surface of the optics housing to align the dome window relative to the optics housing and limit aerodynamically generated conductive heat transfer from the dome window to the optics housing.

14. An optical sensor cover system as in claim 13 wherein the removable connection comprises an O-ring seal pressing against the window.

15. An optical sensor cover system as in claim 14 further comprising a main housing having the optics housing connected thereto, wherein the removable connection comprises a flange member removably connected to the main housing which pressing the O-ring seal against the window and, wherein the O-ring seal forms a seal with the main housing and the window.

16. An optical sensor cover system as in claim 13 further comprising a heater assembly connected between the optics housing and the dome window, wherein the heater assembly is thermally insulated from the optics housing.

17. A method of mounting a window to an optics housing in an aircraft optical sensor system, the method comprising steps of:
bonding the window to a window frame such that the window is locatable at an exterior of an aircraft when the aircraft optical sensor system is connected to the aircraft;
removably connecting the window frame to the optics housing at a removable connection, the removable connection comprising alignment members extending between the window frame and the optics housing to align the window relative to an open area of the optics housing; and
providing heat transfer insulation between the window and the optics housing.

18. A method as in claim 17 further comprising connecting a heater to the window, and thermally insulating the heater from the optics housing.

19. A method as in claim 18 wherein the heater is located at least partially in the window frame.

20. An aircraft optical sensor cover system comprising:
an aircraft optics housing adapted to house an optical sensor therein and connect the optical sensor to an aircraft; and
a window connected to the optics housing by a removable connection;
a heater assembly connected between the optics housing and the window, wherein the heater assembly is thermally insulated from the optics housing,
wherein the removable connection comprises thermal insulation between the window and the optics housing which comprises a heat transfer limiting system to limit heat transfer from the window from the aerodynamic heating to the optics housing.

* * * * *